(12) United States Patent
Kim et al.

(10) Patent No.: US 7,846,784 B2
(45) Date of Patent: Dec. 7, 2010

(54) THIN FILM TRANSISTOR ARRAY PANEL AND MANUFACTURING METHOD THEREOF

(75) Inventors: Beom-Jun Kim, Seoul (KR); Sun-Ok Song, Guri-si (KR); Myung-Koo Hur, Anyang-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 455 days.

(21) Appl. No.: 11/346,717

(22) Filed: Feb. 3, 2006

(65) Prior Publication Data
US 2006/0189054 A1    Aug. 24, 2006

(30) Foreign Application Priority Data
Feb. 4, 2005    (KR) .................... 10-2005-0010796

(51) Int. Cl.
*H01L 21/00* (2006.01)
(52) U.S. Cl. .............. 438/149; 438/151; 438/152; 438/153; 438/161
(58) Field of Classification Search .......... 438/149–166
See application file for complete search history.

(56) References Cited

U.S. PATENT DOCUMENTS

| | | | | |
|---|---|---|---|---|
| 2004/0129943 | A1* | 7/2004 | Yoo et al. | 257/72 |
| 2004/0222421 | A1* | 11/2004 | Lee et al. | 257/66 |
| 2005/0059199 | A1* | 3/2005 | Yamazaki et al. | 438/200 |
| 2005/0110931 | A1* | 5/2005 | Yoo et al. | 349/141 |
| 2005/0186698 | A1* | 8/2005 | Ishida et al. | 438/99 |
| 2006/0008952 | A1* | 1/2006 | Wu et al. | 438/149 |

* cited by examiner

*Primary Examiner*—N Drew Richards
*Assistant Examiner*—Jae Lee
(74) *Attorney, Agent, or Firm*—F. Chau & Associates, LLC

(57) ABSTRACT

A method of manufacturing a thin film transistor array panel includes forming a gate line including a gate electrode on a substrate, forming a gate insulating layer on the gate line, forming a semiconductor layer on the gate insulating layer, forming an ohmic contact layer on the semiconductor layer, and forming a data line including a source electrode and a drain electrode on the ohmic contact layer. The method further includes depositing a conductive film on the data line and the drain electrode, forming a first photoresist on the conductive film, etching the conductive film using the first photoresist as a mask to form a pixel electrode at least connected to the drain electrode, depositing a passivation layer, and removing the first photoresist to form a passivation member.

16 Claims, 19 Drawing Sheets

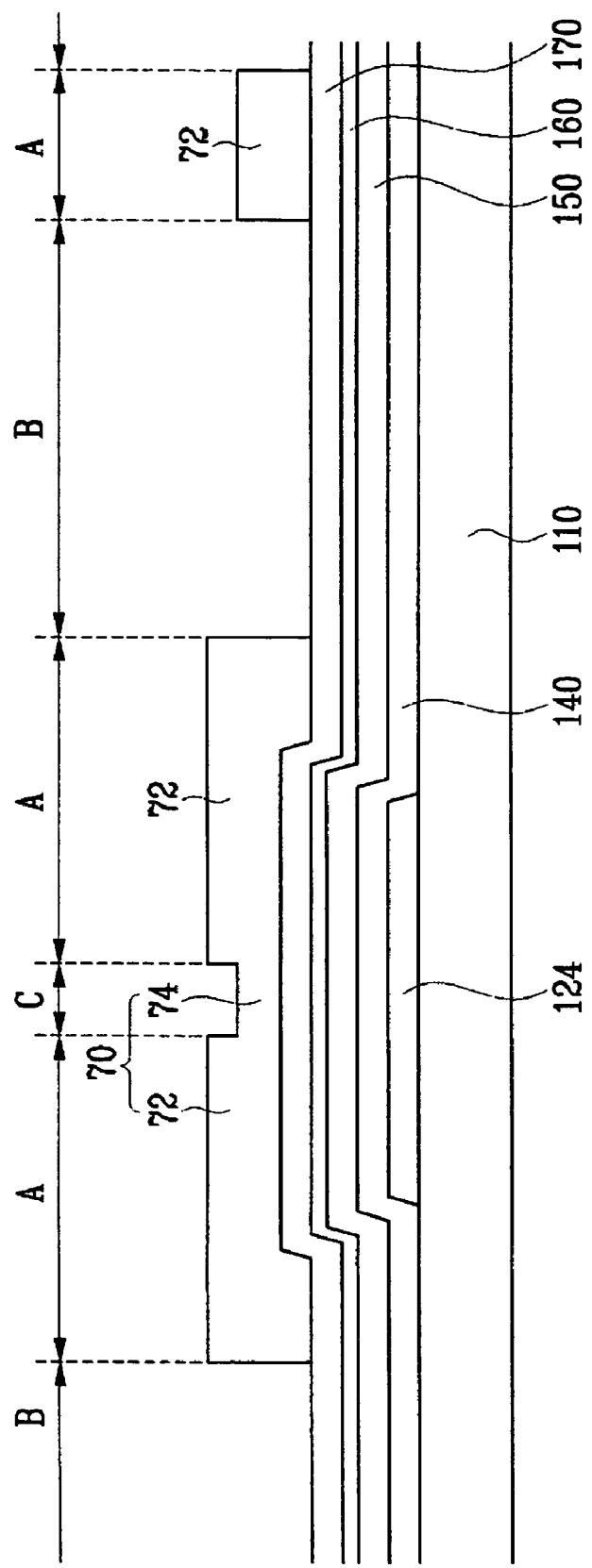

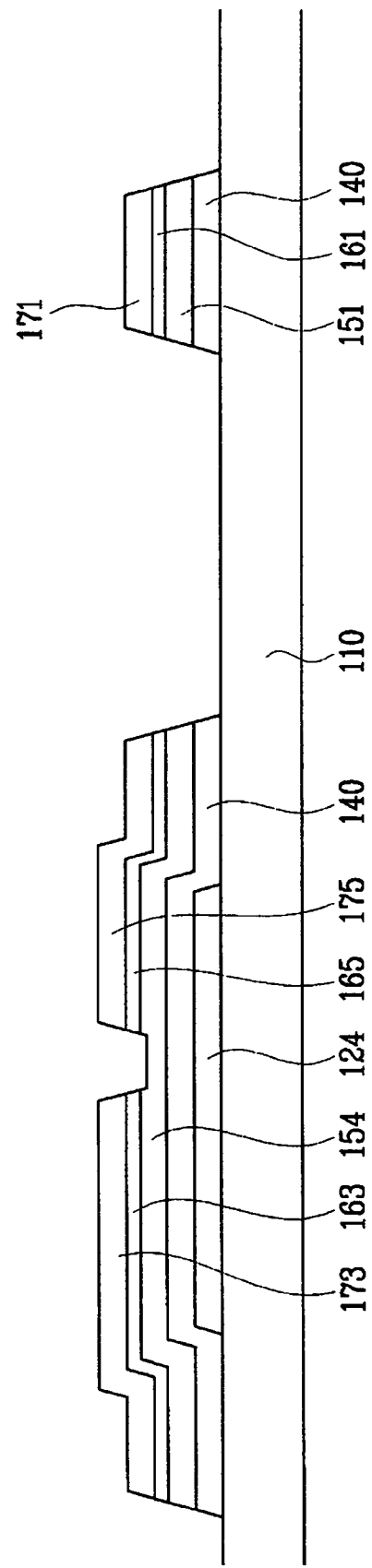

THIN FILM TRANSISTOR ARRAY PANEL AND MANUFACTURING METHOD THEREOF

CROSS-REFERENCE TO RELATED APPLICATIONS

This application claims the benefit of Korean Patent Application No. 2005-0010796, filed on Feb. 04, 2005, in the Korean Intellectual Property Office, the disclosure of which is incorporated herein by reference.

BACKGROUND OF THE INVENTION (a) Field of the Invention

The present invention relates to a thin film transistor array panel and a manufacturing method thereof.

(b) Description of Related Art

An active type of display device, such as a liquid crystal display (LCD) or an organic light emitting display (OLED), includes a plurality of pixels arranged in a matrix, field generating electrodes and switching elements. The switching elements include three-terminal thin film transistors (TFTs) each having a gate, a source, and a drain. The TFT of each pixel selectively transmits data signals to a respective field-generating electrode in response to gate signals.

The display device further includes a plurality of signal lines for transmitting signals to the switching elements, which include gate lines for transmitting gate signals and data lines for transmitting data signals.

Each of the LCD and the OLED devices include a panel provided with the TFTs, the field-generating electrodes, and the signal lines, which are referred to as a TFT array panel.

The TFT array panel has a layered structure that includes conductive layers and insulating layers. The gate lines, the data lines, and the field-generating electrodes are formed of different conductive layers and are separated by the insulating layers.

The TFT array panel having the layered structure is manufactured by repeated lithography and etching steps. The lithography steps are time intensive and costly.

Therefore, a need exists for a TFT formed by a reduced the number of lithography steps.

SUMMARY OF THE INVENTION

A method of manufacturing a thin film transistor array panel includes forming a gate line including a gate electrode on a substrate, forming a gate insulating layer on the gate line, forming a semiconductor layer on the gate insulating layer, forming an ohmic contact layer on the semiconductor layer, and forming a data line including a source electrode and a drain electrode on the ohmic contact layer. The method further includes depositing a conductive film on the data line and the drain electrode, forming a first photoresist on the conductive film, etching the conductive film using the first photoresist as a mask to form a pixel electrode at least connected to the drain electrode; depositing a passivation layer; and removing the first photoresist to form a passivation member.

A portion of the passivation layer deposited on the first photoresist is removed with the first photoresist, and a portion of the substrate and the drain electrode are exposed. The exposed substrate and the drain electrode are enclosed by the gate line and the data line.

It is preferable that a portion of the pixel electrode is contacted to an exposed portion of the substrate. The formation of the pixel electrode includes forming contact assistants on the gate line and the data line.

The formation of the semiconductor layer and the formation of the data line includes depositing the gate insulating layer, the semiconductor layer, the ohmic contact layer, and a conductive layer in sequence, wherein the semiconductor layer is an intrinsic a-Si layer and the ohmic contact layer is an extrinsic a-Si layer, forming a second photoresist on the conductive layer, having different thicknesses on different portions of the conductive layer, selectively etching the conductive layer, the semiconductor layer, and the ohmic contact layer using the second photoresist as a mask, etching the second photoresist to form a third photoresist, and selectively etching the data conductor, the semiconductor layer, and the semiconductor layer using the third photoresist as a mask to form the data line and the drain electrode, and the ohmic contact layer.

The second photoresist may be formed by using a photomask including a light blocking area, a translucent area, and a light transmitting area. An ashing process may be executed to form the third photoresist. The ashing process may be executed until a portion of the second photoresist facing the translucent area of the photomask is removed.

The data line and the drain electrode may include molybdenum or chromium, and the pixel electrode may include indium tin oxide, amorphous indium tin oxide, or indium zinc oxide.

The method may further include forming a storage electrode line with the same layer as the gate line. The pixel electrode and the storage electrode line may be overlapped to each other via the drain electrode.

A thin film transistor array panel includes a gate line formed on a substrate, a gate insulating layer formed on the gate line, a semiconductor layer formed on the gate insulating layer and having substantially the same edge line as that of the gate insulating layer, a data line and a drain electrode formed on the semiconductor layer, a pixel electrode formed on a first portion of the drain electrode and the substrate, and a passivation member formed on the data line and a second portion of the drain electrode, and having a boundary meeting a boundary of the pixel electrode.

The semiconductor layer may have substantially the same planar shape as the data line and the drain electrode except at a portion disposed between the data line and the drain electrode.

The panel may further include a contact assistant connected to an exposed portion of the gate line and the data line, wherein the contact assistant has a boundary substantially equal to the boundary of the passivation member.

The pixel electrode may have a cutout.

BRIEF DESCRIPTION OF THE DRAWINGS

The present invention will become more apparent by describing embodiments thereof in detail with reference to the accompanying drawings, in which:

FIGS. 5A and 5B illustrate the step following the step shown in FIGS. 4A and 4B, where FIG. 5A is a sectional view of the TFT array panel shown in FIG. 3 taken along the line IVa-IVa' and FIG. 5B is a sectional view of the TFT array panel shown in FIG. 3 taken along the line IVb-IVb';

FIG. 7A is a sectional view of the TFT array panel shown in FIG. 6 taken along the line VIIa-VIIa';

FIG. 8A is a sectional view of the TFT array panel shown in FIG. 6 taken along the line VIIa-VIIa' and FIG. 8B is a sectional view of the TFT array panel shown in FIG. 6 taken along the lines VIIb-VIIb-;

DETAILED DESCRIPTION OF PREFERRED EMBODIMENTS

The present invention will be described more fully hereinafter with reference to the accompanying drawings, in which preferred embodiments of the invention are shown. This invention may, however, be embodied in many different forms and should not be construed as limited to the embodiments set forth herein. Like numerals refer to like elements throughout.

A TFT array panel according to an embodiment of the present invention will be described in detail with reference to FIGS. 1, 2A, and 2B.

Figure 1:
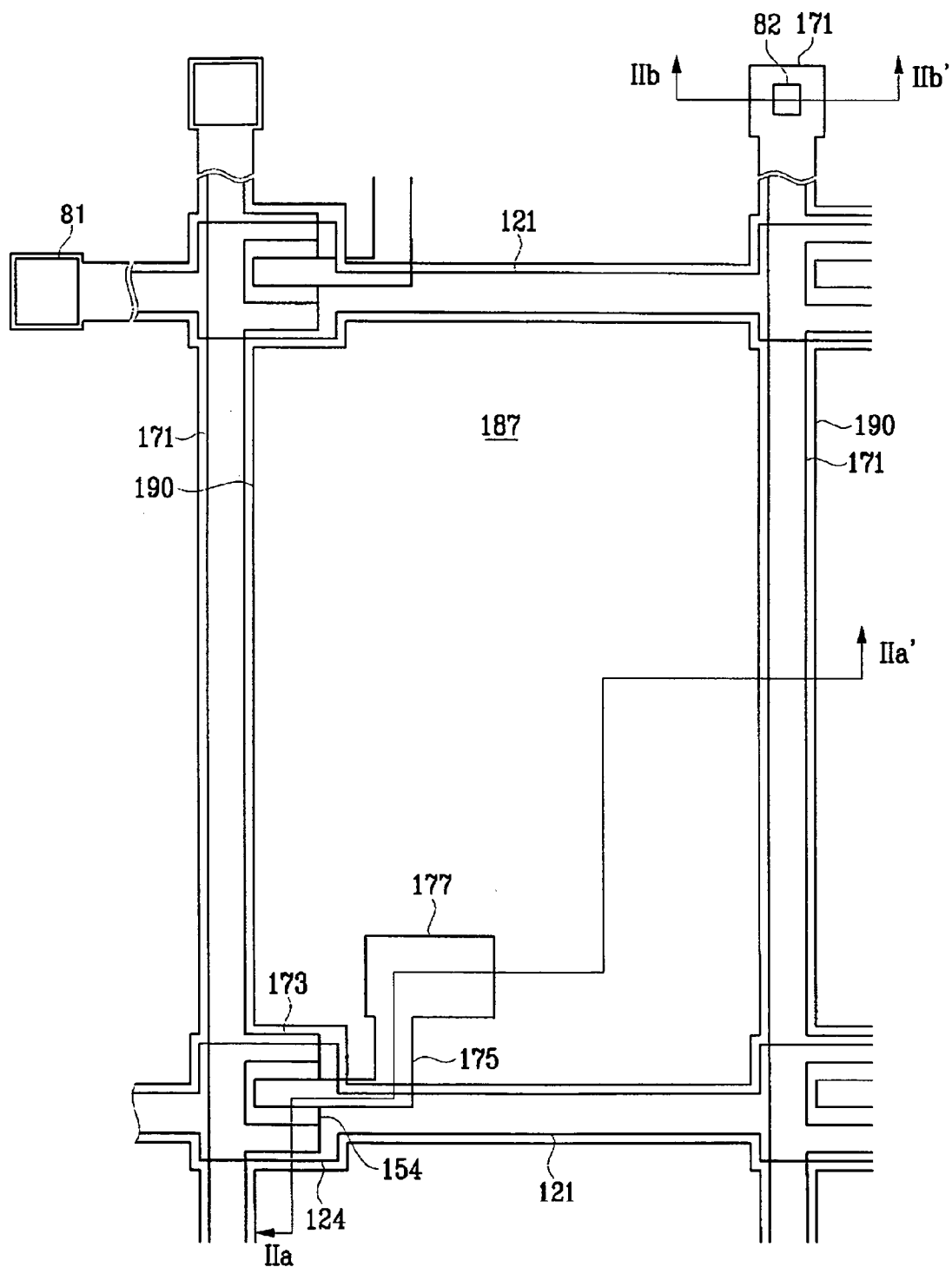
FIG. 1 is a layout view of a TFT array lower panel according to an embodiment of the present invention.
Figure 2A:
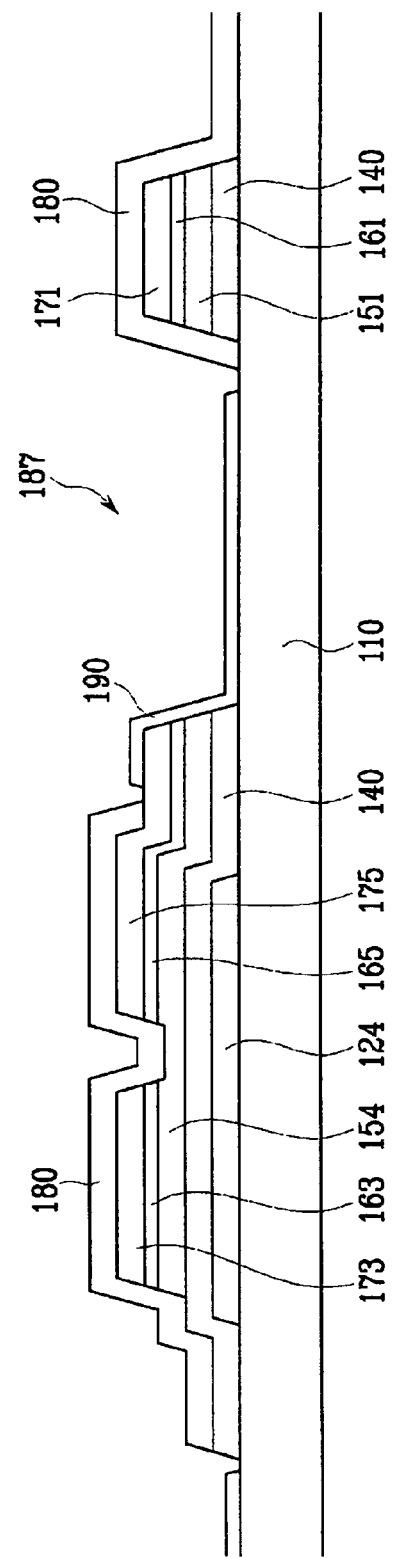
FIG. 2A is a sectional view of the TFT array panel shown in FIG. 1 taken along the line IIa-IIa'.
Figure 2B:
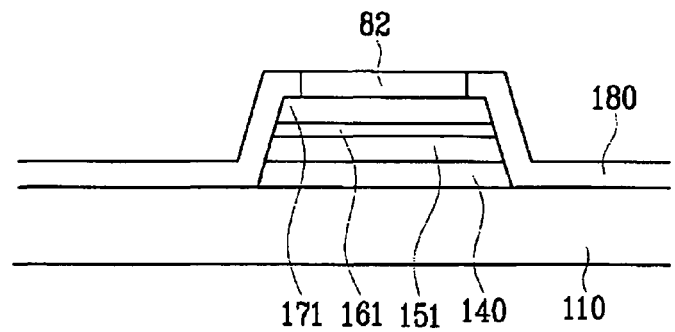
FIG. 2B is a sectional view of the TFT array panel shown in FIG. 1 taken along the line IIb-IIb'.

FIG. 1 is a layout view of a TFT array lower panel, FIG. 2A is a sectional view of the TFT array panel shown in FIG. 1 taken along the line IIa-IIa', and FIG. 2B is a sectional view of the TFT array panel shown in FIG. 1 taken along the lines IIb-IIb'.

A plurality of gate lines 121 are formed on an insulating substrate 110. The insulating substrate 110 may be formed of a material such as transparent glass or plastic.

The gate lines 121 transmit gate signals and extend substantially in a transverse direction. Each of the gate lines 121 includes a plurality of gate electrodes 124 projecting upward and having an area for contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated in the substrate 110. The gate lines 121 may extend to be connected to a driving circuit.

The gate lines 121 are preferably made of an Aluminum (Al)-containing metal such as Al or an Al alloy, a Silver (Ag)-containing metal such as Ag or a Ag alloy, a Copper (Cu)-containing metal such as Cu or a Cu alloy, a Molybdenum (Mo)-containing metal such as Mo or a Mo alloy, Chromium (Cr), Tantalum (Ta), or Titanium (Ti). The gate lines 121 may have a multi-layered structure including conductive films (not shown) having different physical characteristics. For example, in a multi-layered structure having two conductive films, one of the two films is preferably made of a metal such as an Al-containing metal, a Ag-containing metal, or a Cu-containing metal having a desirable resistivity for imparting a desirable signal delay or voltage drop. The other film is preferably made of a material such as a Mo-containing metal, Cr, Ta, or Ti, which have desirable physical, chemical, and electrical contact characteristics with other materials such as indium tin oxide (ITO) or indium zinc oxide (IZO). Desirable examples of the combination of the two films are a lower Cr film and an upper Al (alloy) film or a lower Al (alloy) film and an upper Mo (alloy) film. The gate lines 121 may be made of various metals or conductors.

The lateral sides of the gate lines 121 are inclined relative to a surface of the substrate 110, and the inclination angle thereof ranges between about 30-80 degrees.

A gate insulating layer 140, preferably made of silicon nitride ($SiN_x$) or silicon oxide ($SiO_x$), is formed on the gate lines 121.

A plurality of semiconductor stripes 151, preferably made of hydrogenated amorphous silicon (abbreviated to "a-Si") or polysilicon, are formed on the gate insulating layer 140. The semiconductor stripes 151 extend substantially in a longitudinal direction. Each of the semiconductor stripes 151 includes a plurality of projections 154 branched out toward respective gate electrodes 124.

A plurality of ohmic contact stripes and islands 161 and 165 are formed on the semiconductor stripes 151. The ohmic contact stripes and islands 161 and 165 are preferably made of n+ hydrogenated a-Si doped with an N-type impurity such as phosphorous, or they may be made of silicide. Each ohmic contact stripe 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are preferably in a range of about 30-80 degrees.

A plurality of data lines 171 and a plurality of drain electrodes 175 are formed on the ohmic contacts 161 and 165, respectively, and on the gate insulating layer 140.

The data lines 171 transmit data signals and extend substantially in the longitudinal direction to intersect the gate lines 121. Each data line 171 includes a plurality of source electrodes 173 projecting toward the gate electrodes 124 and being curved like a crescent, and an end portion having an area for contact with another layer or an external driving circuit. A data driving circuit (not shown) for generating the data signals may be mounted on an FPC film (not shown), which may be attached to the substrate 110, directly mounted on the substrate 110, or integrated in the substrate 110. The data lines 171 may extend to be connected to a driving circuit.

The drain electrodes 175 are separated from the data lines 171 and disposed opposite the source electrodes 173 with respect to the gate electrodes 124. Each of the drain electrodes 175 includes a widened end portion 177 having an area for contact with another layer, and a relatively narrower end portion. The narrower end portion is partly enclosed by a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of a refractory metal such as Cr, Mo, Ta, Ti, or alloys thereof. The data lines 171 may have a multilayered structure including a refractory metal film (not shown) and a low resistivity film (not shown). Examples of the multi-layered structure are a double-layered structure including a lower Cr/Mo (alloy) film and an upper Al (alloy) film, and a triple-layered structure of a lower Mo (alloy) film, an intermediate Al (alloy) film, and an upper Mo (alloy) film. The data lines 171 and the drain electrodes 175 may be made of various metals or conductors.

The data lines 171 and the drain electrodes 175 have inclined edge profiles, and the inclination angles thereof range between about 30-80 degrees.

The ohmic contacts 161 and 165 are interposed between the underlying semiconductor stripes 151 and the overlying conductors 171 and 175 thereon.

The semiconductor stripes 151 have substantially the same planar shapes as the data lines 171 and the drain electrodes 175 as well as the underlying ohmic contacts 161 and 165. The semiconductor stripes 151 include some exposed portions, which are not covered with the data lines 171 and the drain electrodes 175, such as portions located between the source electrodes 173 and the drain electrodes 175.

A passivation member 180 is formed on the gate lines 121, the data lines 171, the drain electrodes 175, and the exposed portions of the semiconductor stripes 151.

The passivation member 180 is made of an inorganic insulator such as silicon nitride. The passivation member 180 may be made of an organic insulator having a desirable flatness characteristic and photosensitivity, or a low dielectric insulating material that has a dielectric constant lower than about 4.0 such as a-Si:C:O and a-Si:O:F formed by plasma enhanced chemical vapor deposition (PECVD). The passivation layer 180 may have a double-layered structure including a lower inorganic film and an upper organic film.

The passivation member 180 has a plurality of first contact holes exposing the end portions of the data lines 171. The passivation member 180 and the gate insulating layer 140 have a plurality of second contact holes exposing end portions of the gate lines 121 and lower sidewalls with a plurality of openings 187 exposing areas enclosed by the gate lines 121 and the data lines 171.

A plurality of pixel electrodes 190 are formed on the exposed substrate 110 in the openings 187, respectively. A plurality of contact assistants 81 and 82 are formed in the second and first contact holes, respectively. The contact assistants 81 and 82 are preferably made of a transparent conductor such as ITO, IZO, or a-ITO, or a reflective conductor such as Ag, Al, Cr, or alloys thereof.

The pixel electrodes 190 are physically and electrically connected to the drain electrodes 175 through the openings 187 such that the pixel electrodes 190 receive data voltages from the drain electrodes 175. The pixel electrodes 190 supplied with the data voltages generate electric fields in cooperation with a common electrode of an opposing color filter panel supplied with a common voltage, which determine the orientations of liquid crystal molecules (not shown) of a liquid crystal layer disposed between two panels.

The contact assistants 81 and 82 are connected to the end portions of the gate lines 121 and the end portions of the data lines 171 through respective contact holes. The contact assistants 81 and 82 protect the end portions and enhance the adhesion between the end portions and external devices.

The boundaries of the pixel electrodes 190 and the contact assistants 81 and 82 substantially coincide.

A method of manufacturing the TFT array panel shown in FIGS. 1-2B according to an embodiment of the present invention will be described in detail with reference to FIGS. 3 to 11B as well as FIGS. 1 to 2B.

Figure 3:
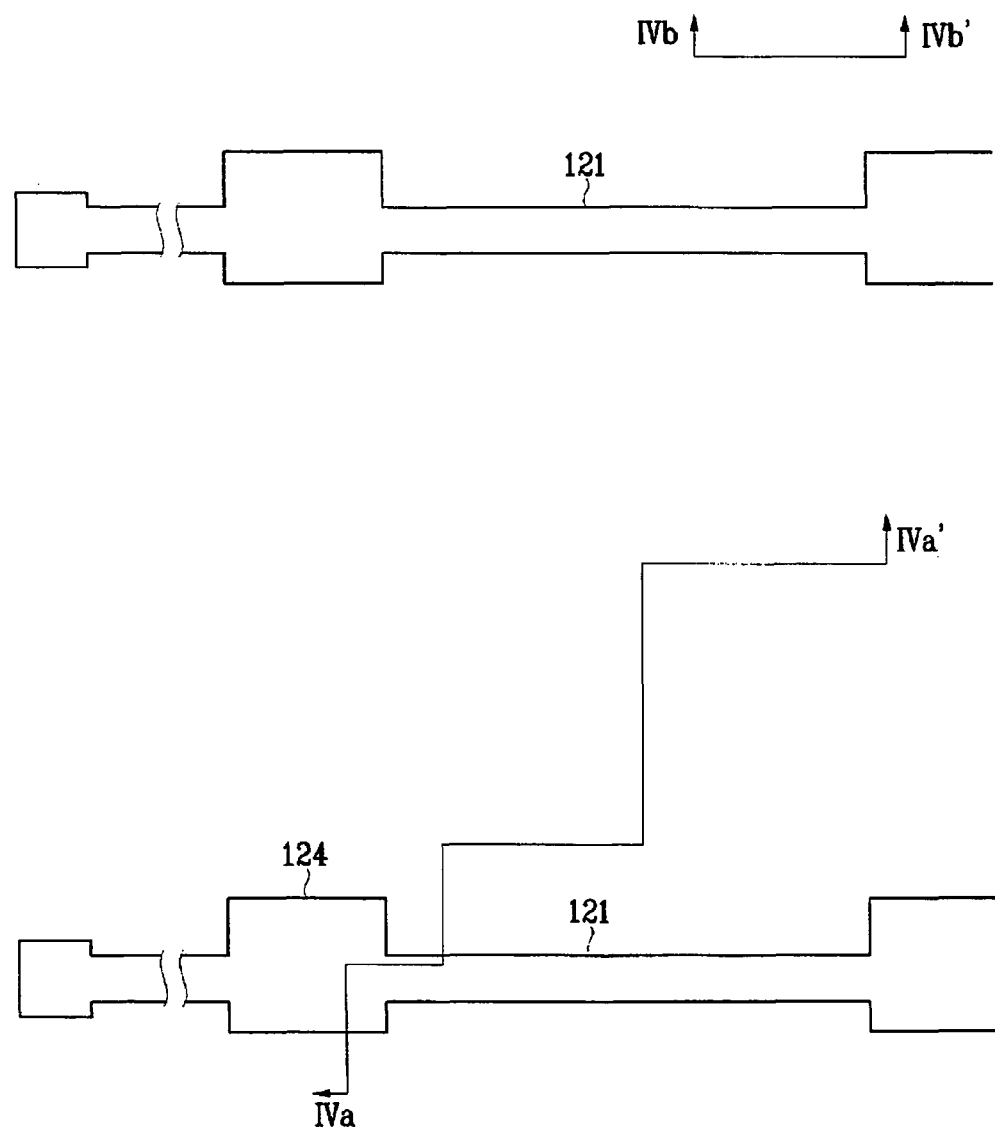
FIGS. 3, 6, and 9 are layout views of a TFT array panel shown in FIGS. 1 to 2B in intermediate steps of a manufacturing method thereof according to an embodiment of the present invention.
Figure 4A:
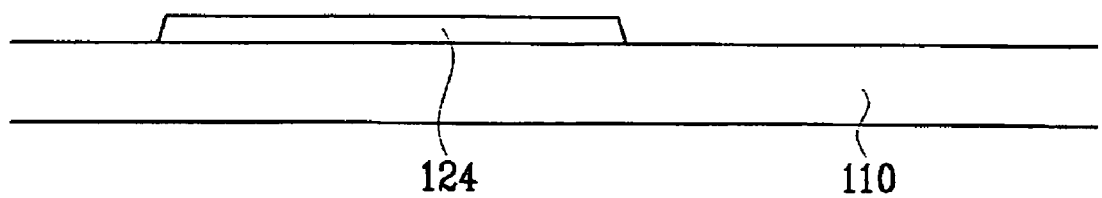
FIG. 4A is a sectional view of the TFT array panel shown in FIG. 3 taken along the line IVa-IVa'.
Figure 4B:
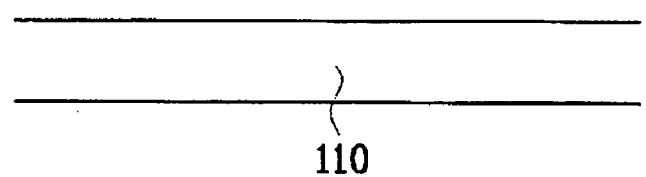
FIG. 4B is a sectional view of the TFT array panel shown in FIG. 3 taken along the line IVb-IVb'.
Figure 5B:
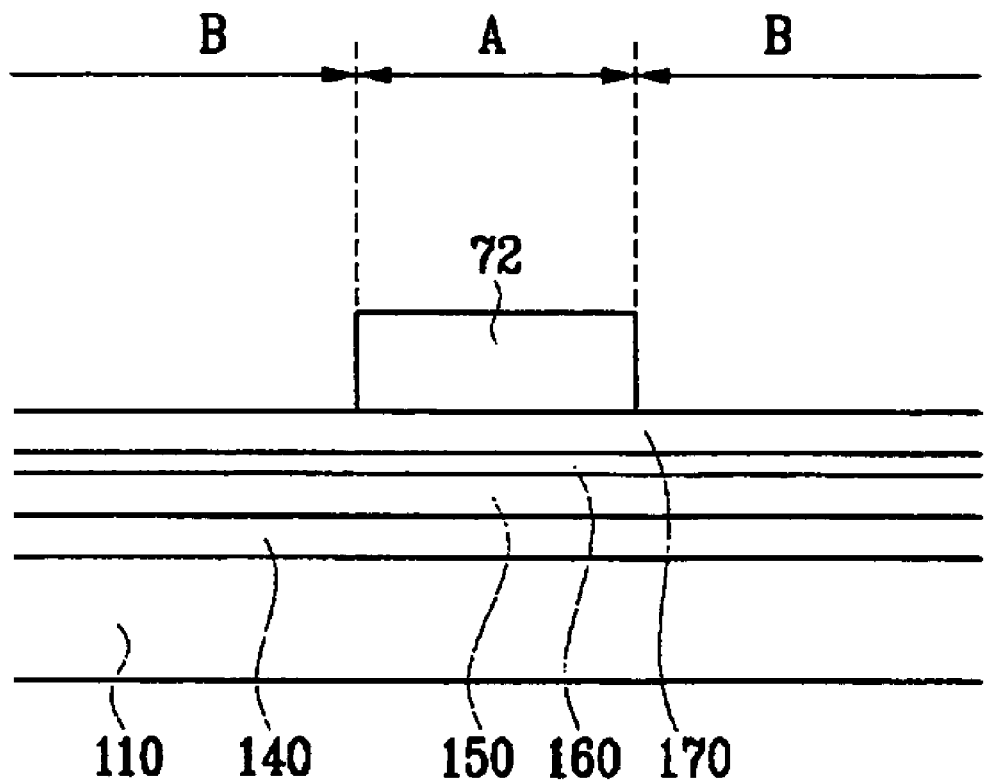
Figure 6:
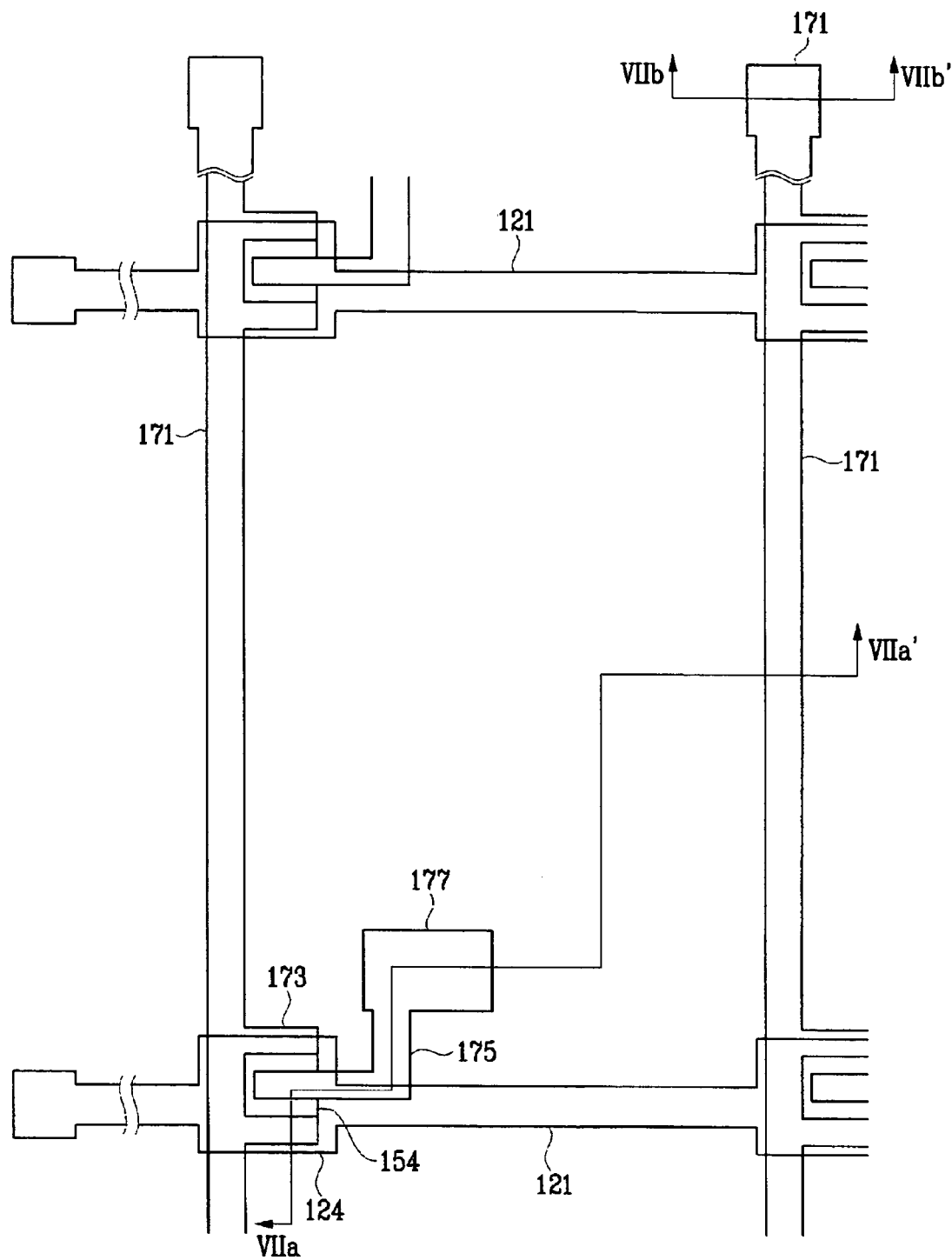
Figure 7B:
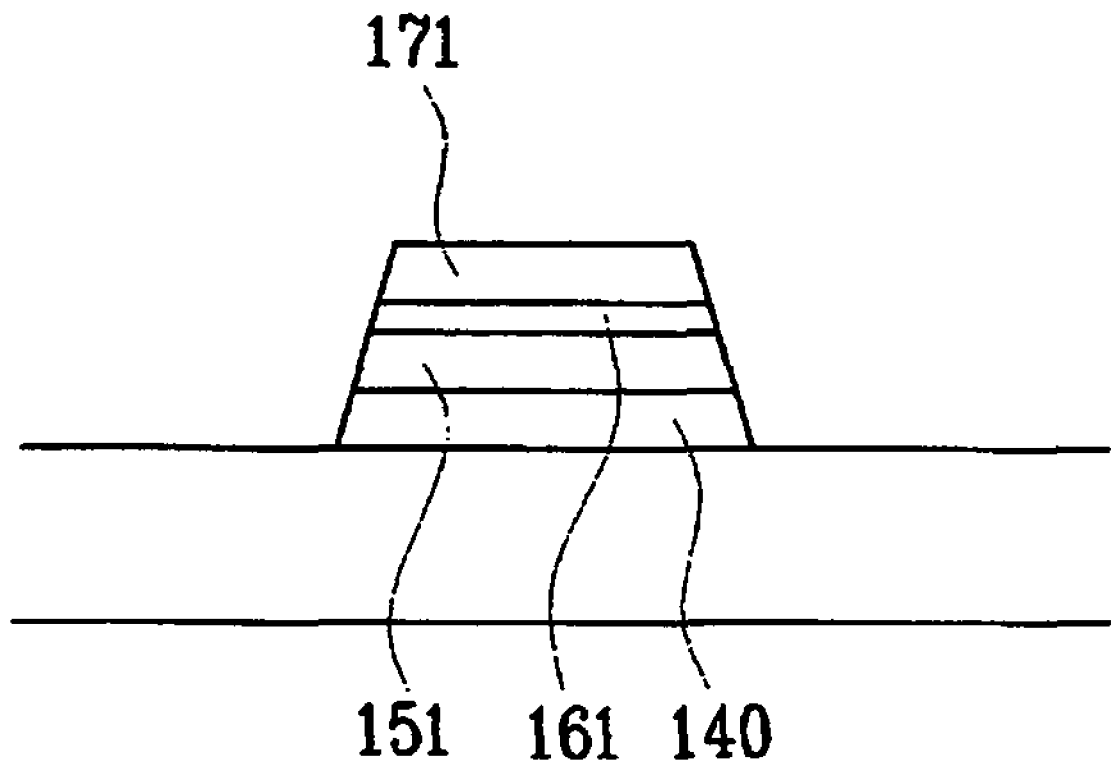
FIG. 7B is a sectional view of the TFT array panel shown in FIG. 6 taken along the lines VIIb-VIIb'.
Figure 8A:
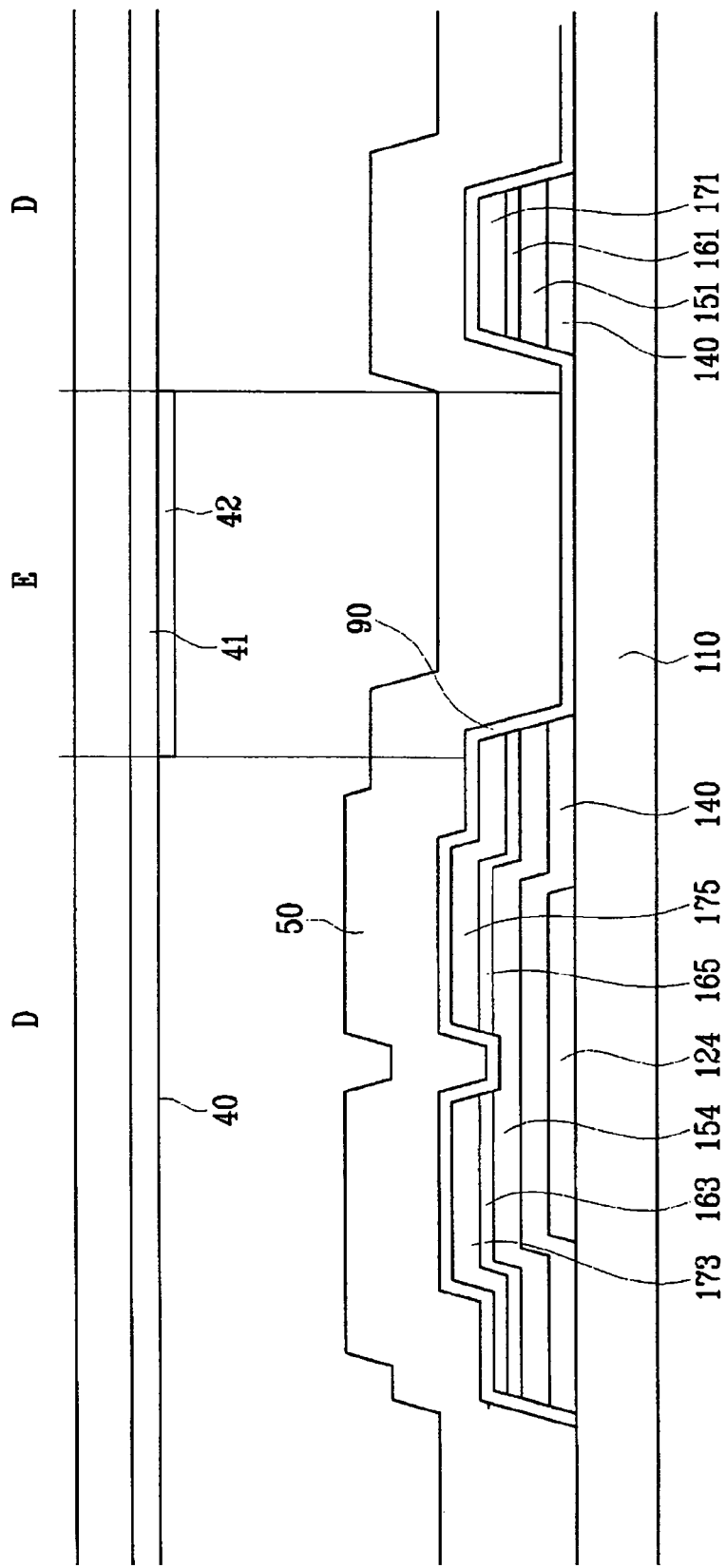
FIGS. 8A and 8B illustrate the step following the step shown in FIGS. 7A and 7B, where
Figure 8B:
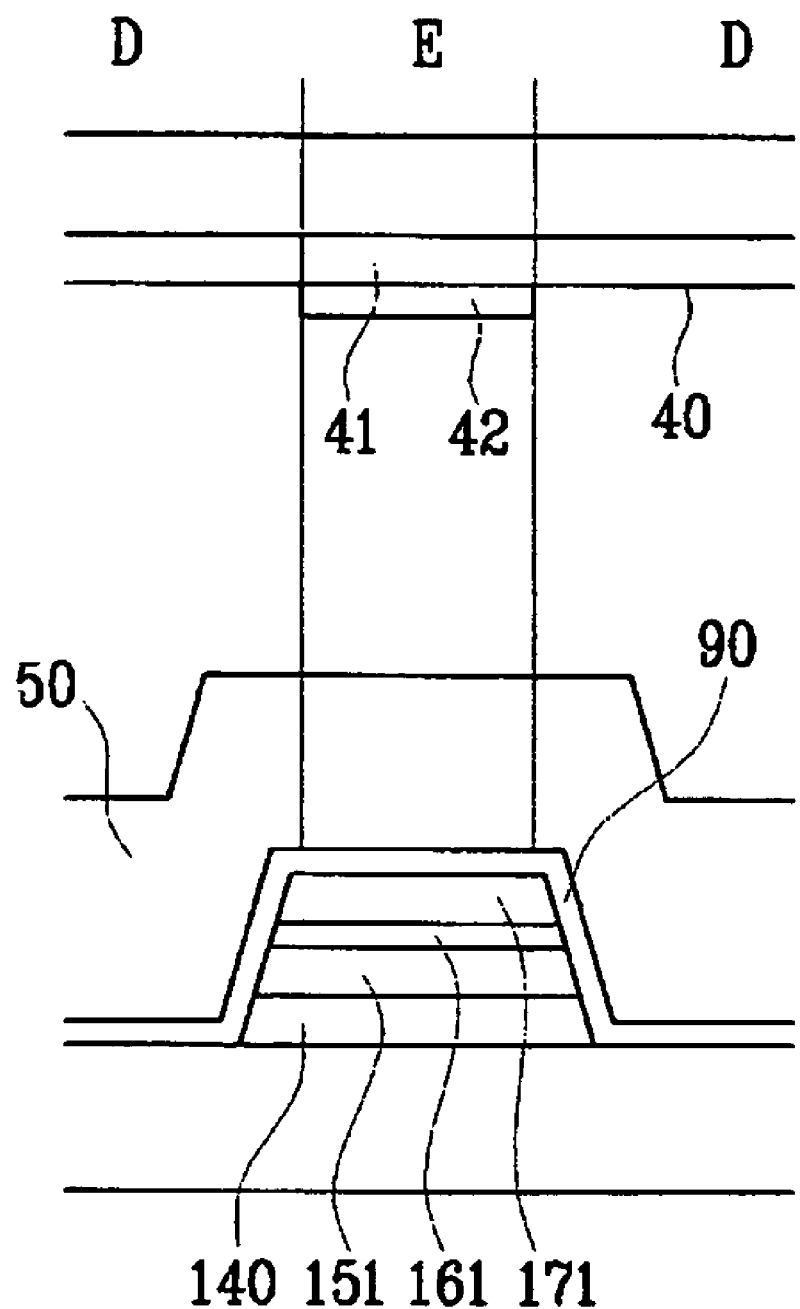
Figure 9:
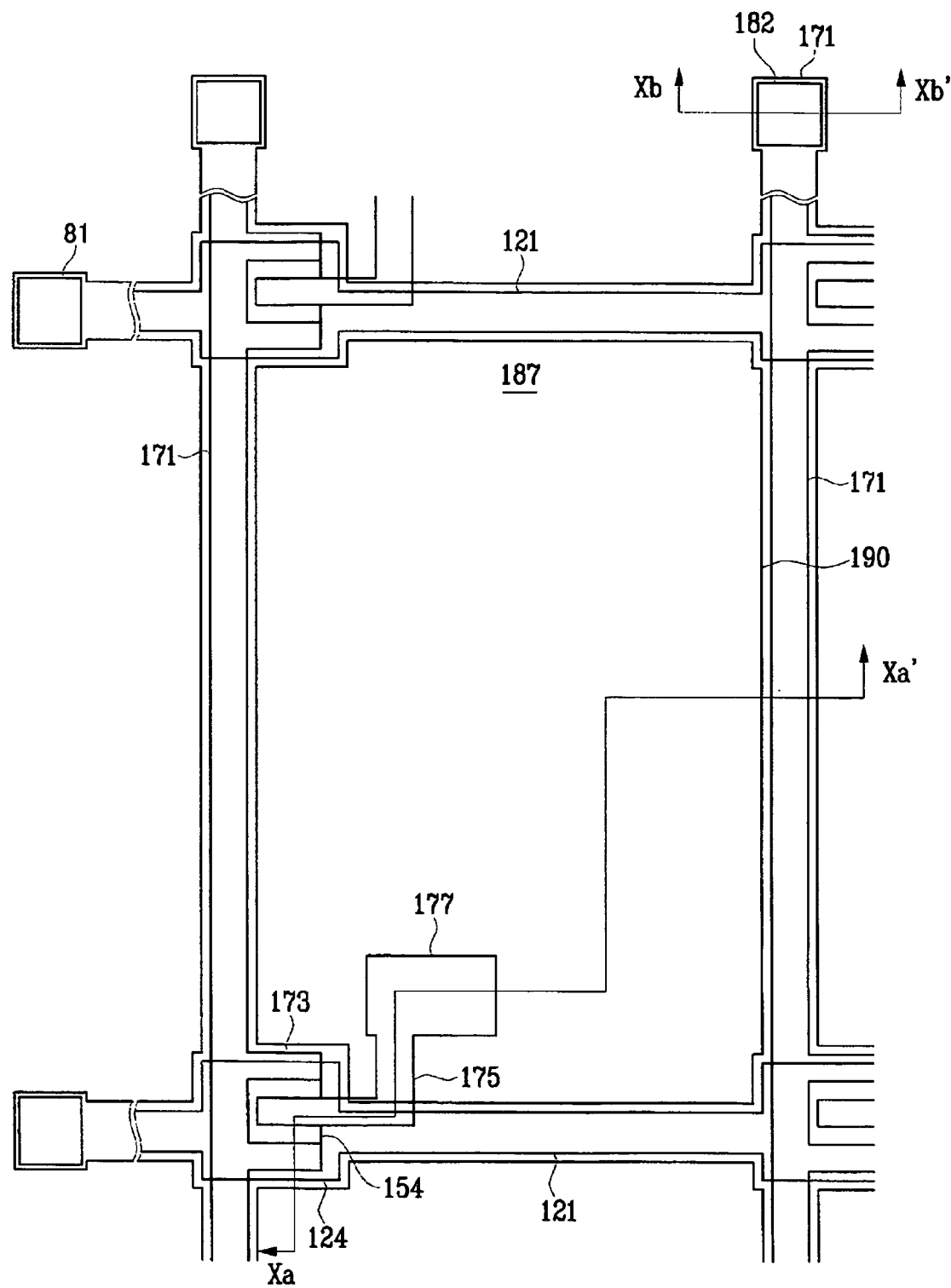
Figure 10A:
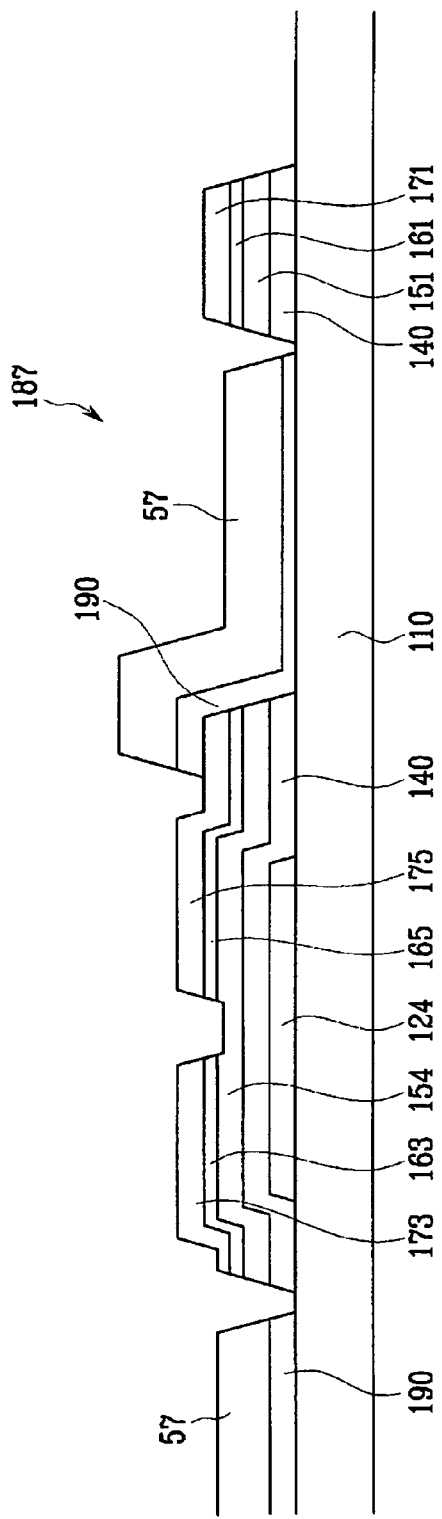
FIG. 10A is a sectional view of the TFT array panel shown in FIG. 9 taken along the line Xa-Xa'.
Figure 10B:
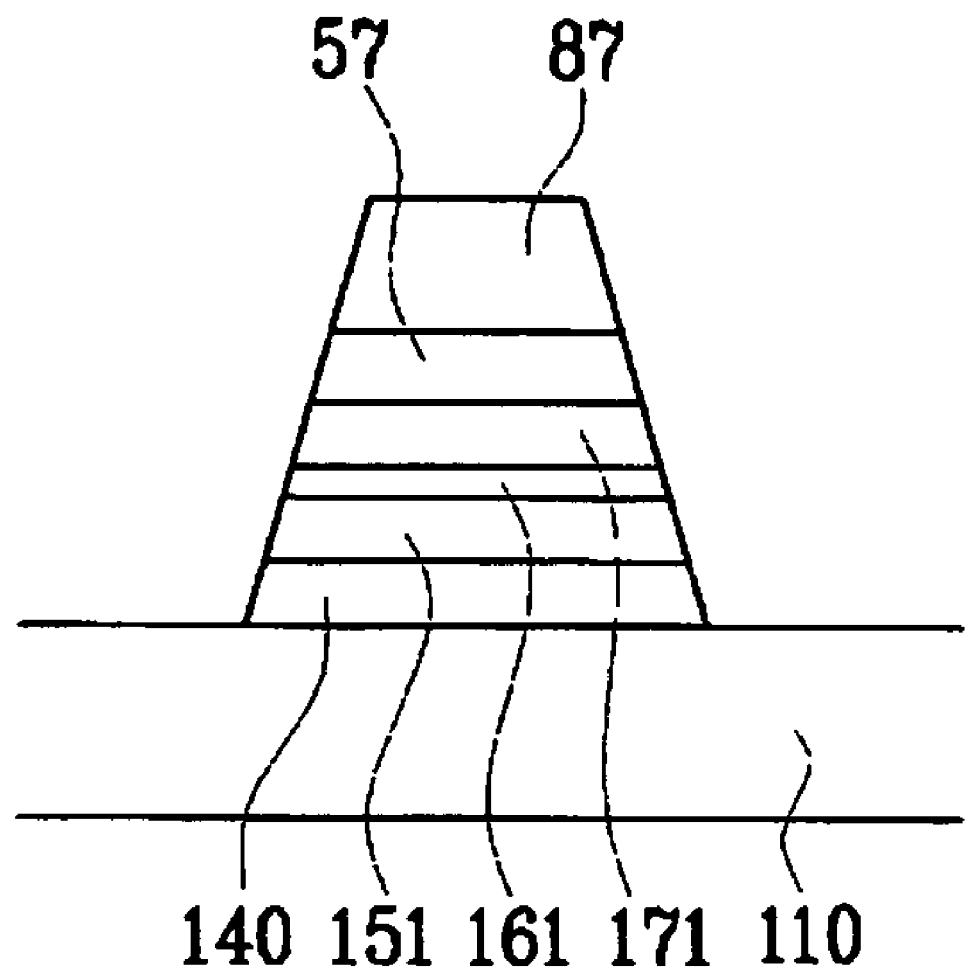
FIG. 10B is a sectional view of the TFT array panel shown in FIG. 9 taken along the lines Xb-Xb'.
Figure 11A:
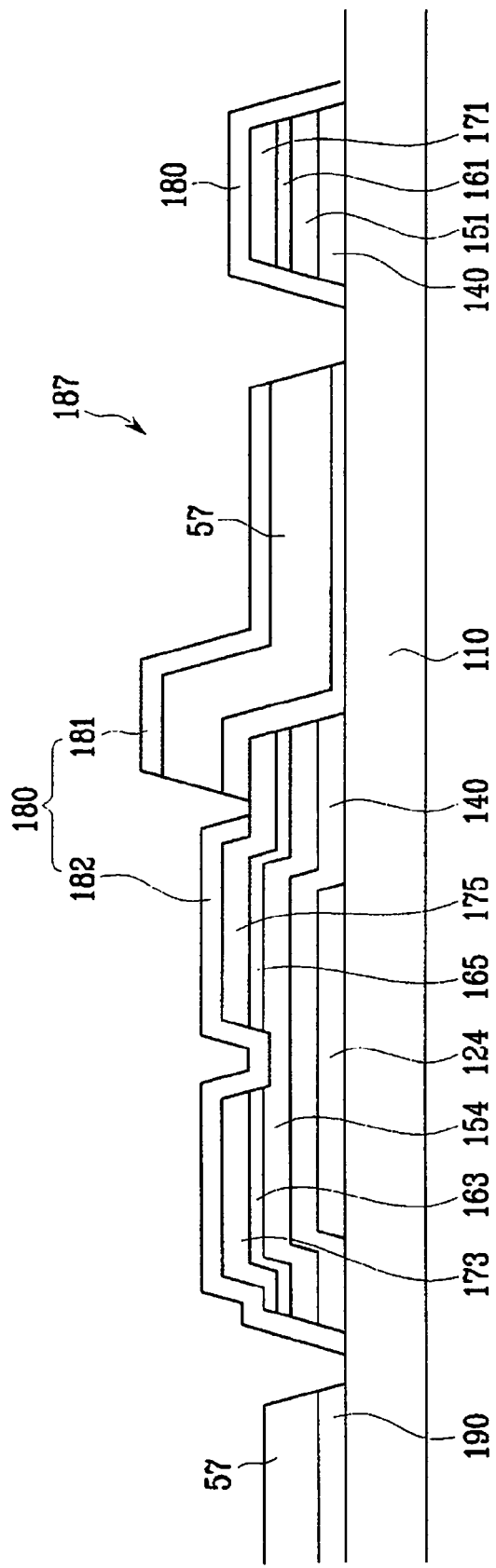
FIG. 11A is a sectional view of the TFT array panel following the step shown in FIG. 10A.
Figure 11B:
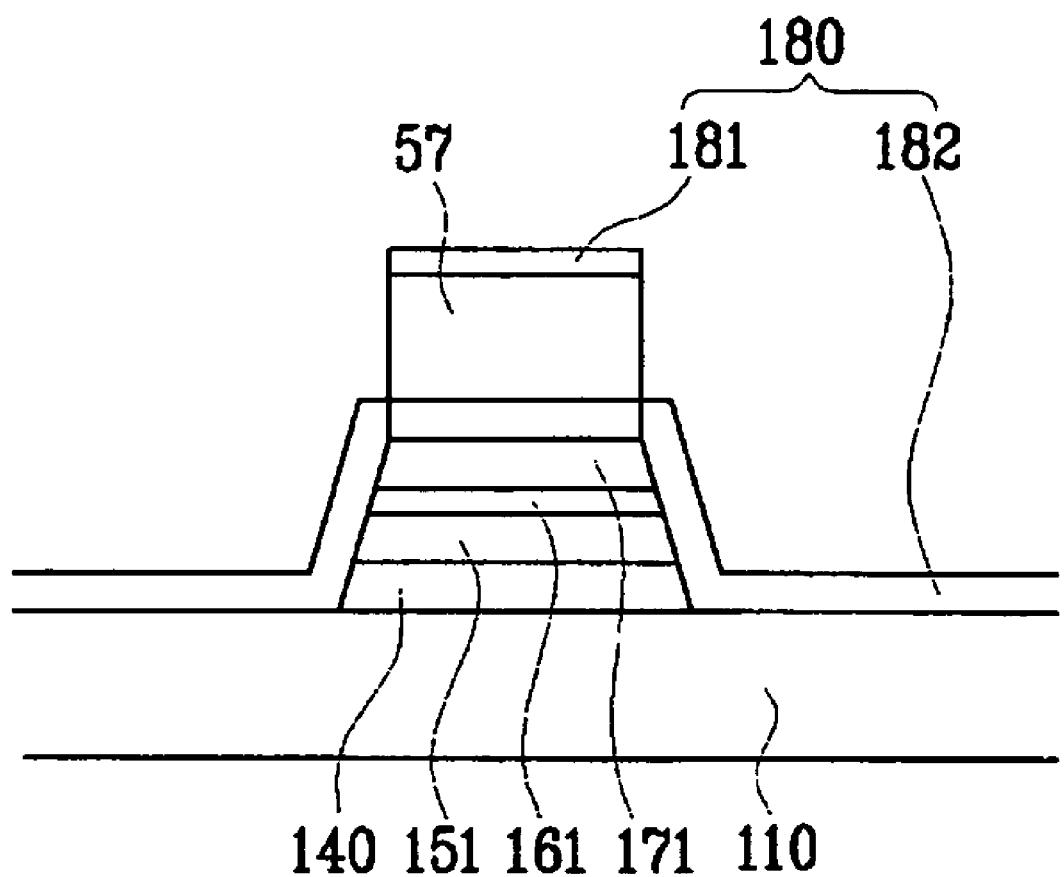
FIG. 11B is a sectional view of the TFT array panel following the step shown in FIG. 10B.

FIGS. 3, 6, and 9 are layout views of a TFT array panel shown in FIGS. 1 to 2B in intermediate steps of a manufacturing method thereof according to an embodiment of the present invention. FIG. 4A is a sectional view of the TFT array panel shown in FIG. 3 taken along the line IVa-IVa', FIG. 4B is a sectional view of the TFT array panel shown in FIG. 3 taken along the line IVb-IVb', and FIGS. 5A and 5B illustrate a step following a step shown in FIGS. 4A and 4B where FIG. 5A is a sectional view of the TFT array panel shown in FIG. 3 taken along the line IVa-IVa' and FIG. 5B is a sectional view of the TFT array panel shown in FIG. 3 taken along the line IVb-IVb'. FIG. 7A is a sectional view of the TFT array panel shown in FIG. 6 taken along the line VIIa-VIIa', FIG. 7B is a sectional view of the TFT array panel shown in FIG. 6 taken along the lines VIIb-VIIb', FIGS. 8A and 8B illustrate a step following a step shown in FIGS. 7A and 7B where FIG. 8A is a sectional view of the TFT array panel shown in FIG. 6 taken along the line VIIa-VIIa' and FIG. 8B is a sectional view of the TFT array panel shown in FIG. 6 taken along the lines VIIb-VIIb'. FIG. 10A is a sectional view of the TFT array panel shown in FIG. 9 taken along the line Xa-Xa', FIG. 10B is a sectional view of the TFT array panel shown in FIG. 9 taken along the lines Xb-Xb', FIG. 11A is a sectional view of the TFT array panel following a step shown in FIG. 10A, and FIG. 11B is a sectional view of the TFT array panel following the step shown in FIG. 10B.

Referring to FIGS. 3 to 4B, a conductive layer preferably made of metal is deposited by sputtering, etc., with a thickness of about 1,000-3,000 Å on an insulating substrate 110 preferably made of transparent glass. The conductive layer is subjected to lithography and etching to form the plurality of gate lines 121 including gate electrodes 124 and end portions 129.

Referring to FIGS. 5A and 5B, the gate insulating layer 140, an intrinsic a-Si layer 150, and an extrinsic a-Si layer 160 are sequentially deposited by CVD. The gate insulating layer 140 is preferably made of silicon nitride and has a thickness of about 2,000-5,000 Å. The deposition temperature of the gate insulating layer 140 is preferably in a range of about 250-400° C.

A conductive layer 170, preferably made of metal, is deposited by sputtering, etc., and a photoresist film 70 with a thickness of about 1-2 microns is coated on the conductive layer 170.

The photoresist film 70 is exposed to light through a photomask (not shown), and is developed such that the developed photoresist has a position-dependent thickness. The photoresist shown in FIGS. 5A and 5B includes a plurality of first to third portions in order of decreasing thickness. The first portions located in wire areas A and the second portions located in channel areas C are indicated by reference numerals 72 and 74, respectively, and no reference numeral is assigned to the third portions at remaining areas B since they have substantially zero thickness to expose underlying portions of the conductive layer 170. The thickness ratio of the second portions 74 to the first portions 72 is adjusted depending upon the process conditions in a subsequent process steps. It is preferable that the thickness of the second portions 74 is equal to or less than half of the thickness of the first portions 72, and in particular, equal to or less than about 4,000 Å.

The position-dependent thickness of the photoresist may be obtained by several techniques, for example, by providing translucent areas on the exposure mask as well as light-transmitting areas and light blocking opaque areas. The translucent areas may have a slit pattern, a lattice pattern, or be thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist, wherein once a photoresist pattern made of a reflowable material is formed by using an exposure mask with only transparent areas and opaque areas, the reflowable material is subject to a reflow process to flow onto areas without the photoresist, thereby forming thin portions.

The different thicknesses of the photoresist 72 and 74 enable selective etching of the underlying layers when using suitable process conditions. Therefore, the plurality of data lines 171 including source electrodes 173 and end portions, the plurality of drain electrodes 175 and the widened end portions 177, the plurality of ohmic contact stripes 161 including projections 163, the plurality of ohmic contact islands 165, and the plurality of semiconductor stripes 151 including projections 154 are obtained as shown in FIGS. 6, 7A, and 7B by a series of etching steps.

For descriptive purposes, portions of the conductive layer 170, the extrinsic a-Si layer 160, and the intrinsic a-Si layer 150 on the wire areas A are referred to as first portions, portions of the conductive layer 170, the extrinsic a-Si layer 160, and the intrinsic a-Si layer 150 on the channel areas B are referred to as second portions, and portions of the conductive layer 170, the extrinsic a-Si layer 160, and the intrinsic a-Si layer 150 on the remaining areas C are referred to as third portions.

An exemplary sequence of forming such a structure is as follows:

(1) Removal of third portions of the conductive layer 170, the extrinsic a-Si layer 160, and the intrinsic a-Si layer 150 in the remaining areas B;

(2) Removal of the second portions 74 of the photoresist;

(3) Removal of the second portions of the conductive layer 170 and the extrinsic a-Si layer 160 in the channel areas C; and (4) Removal of the first portions 72 of the photoresist.

Another exemplary sequence is as follows:

(1) Removal of the third portions of the conductive layer 170;

(2) Removal of the second portions 74 of the photoresist;

(3) Removal of the third portions of the extrinsic a-Si layer 160 and the intrinsic a-Si layer 150;

(4) Removal of the second portions of the conductive layer 170;

(5) Removal of the first portions 72 of the photoresist; and (6) Removal of the second portions of the extrinsic a-Si layer 160.

When the second portions 74 are removed, a thickness of the first portions 72 of the photoresist may be decreased. Since the thickness of the second portions 74 is thinner than that of the first portions 72, the first portions 72 are not removed, and thereby layers underlying the first portions 72 are protected.

The removal of the second portions 74 of the photoresist is performed either simultaneously with or independently from the removal of the third portions of the extrinsic a-Si layer 160 and of the intrinsic a-Si layer 150. Similarly, the removal of the first portions 42 of the photoresist is performed either simultaneously with or independent from the removal of the second portions of the extrinsic a-Si layer 160. For example, a gas mixture of $SF_6$ and HCl or $SF_6$ and $O_2$ may etch the photoresist and the a-Si layers 150 and 160 with substantially equal etch ratios.

Residue of the photoresist remaining on the surface of the conductive layer 170 may be removed by ashing, etc.

For example, a gas mixture of $CF_4$ and HCl or $CF_4$ and $O_2$ may etch the a-Si layers 150 in the first exemplary sequence or the second sequence prior to removal of the second portions of the conductive layer 170, and a gas mixture of $CF_4$ and $O_2$ may etch the a-Si layers 150 with uniform thickness.

Referring to FIGS. 8A and 8B, a conductive film 90 preferably made of IZO, ITO, or amorphous ITO is deposited by sputtering, etc., on the data lines 171, the drain electrode 175, and the exposed insulating substrate 110. When the conductive film 90 is made of IZO, IDIXO (indium x-metal oxide) (manufactured by Idemitsu Co. of Japan) may be used as a target material. The IZO may preferably include $In_2O_3$ and ZnO. The amount of Zn in the total amount of indium and Zn may preferably be about 15 to 20% by atomic weight. The temperature of the sputtering is preferably about 250 degrees Celsius or less, to minimize contact resistance to other conductive layers.

A photosensitive organic layer 50 is coated on the resulting structure. A photomask 40 is aligned with the substrate 110.

The photomask 40 includes a transparent substrate 41 and an opaque light blocking film 42, and is divided into light transmitting areas D and light blocking areas E. The light blocking film 42 is not disposed on the light transmitting areas D, but it is disposed on the light blocking areas E. The light blocking film 42 exists at an area having a width larger than a predetermined value on the light blocking areas E. The light blocking areas E face the areas enclosed by the gate lines 121 and the data lines 171 including a portion of the widened end portion 177 of the drain electrode 175, and the areas on the portions of the end portions of the gate lines 121 and the data lines 171. The transmitting areas D face the remaining portions.

The photosensitive organic layer 50 is exposed to light through the photomask 40 and is developed such that portions of the photosensitive organic layer 50 that receive a predetermined amount of light are removed. Referring to FIGS. 9 to 10B, portions of the photosensitive organic layer 50 facing the light transmitting areas D are removed, and portions of the photosensitive organic layer 50 facing the light blocking areas E remain to be the organic layer 57.

The conductive film 90 is etched using the remaining organic layer 57 as an etch mask to form the plurality of pixel electrodes 190 on the exposed drain electrode 175 and the exposed substrate 110 and the plurality of contact assistants 81 and 82 in the end portions of the gate lines 121 and the data lines 171, Referring to FIGS. 11A and 11B, the passivation layer 180 is deposited on the substrate 110.

The passivation layer 180 includes a first portion 181 facing the pixel electrodes 190 and the contact assistants 81 and 82, and a second portion 182 facing the remaining portion except for the first portion 181. Because the first and second portions 181 and 182 of the passivation layer 180 have a height difference due to the thick thickness of the organic layer 57, the first and second portions 181 and 182 of the passivation layer 180 are at least divided from each other, and a crack is formed between the first and second portions 181 and 182. Accordingly, a portion of the sidewall of the organic layer 57 is exposed.

The substrate 110 is dipped into a developer such that the developer infiltrates the organic layer 57 through the exposed lateral sides of the organic layer 57 to remove the organic layer 57. The first portions 181 of the passivation layer 180 disposed on the organic layer 57 come off along with the organic layer 57, which is a lift-off. As a result, the second portions 182 of the passivation layer 180 are lifted, as shown in FIGS. 1, 2A, and 2B, and a passivation member 180 is completed.

As described above, the manufacturing method of the TFT array panel according to an embodiment simultaneously forms the data lines 171, the drain electrodes 175, the semiconductors 151, and the ohmic contacts 161 and 165 using a lithography step, and a lithography step for forming the passivation member 180 having the openings and the contact holes may be omitted.

Figure 12:
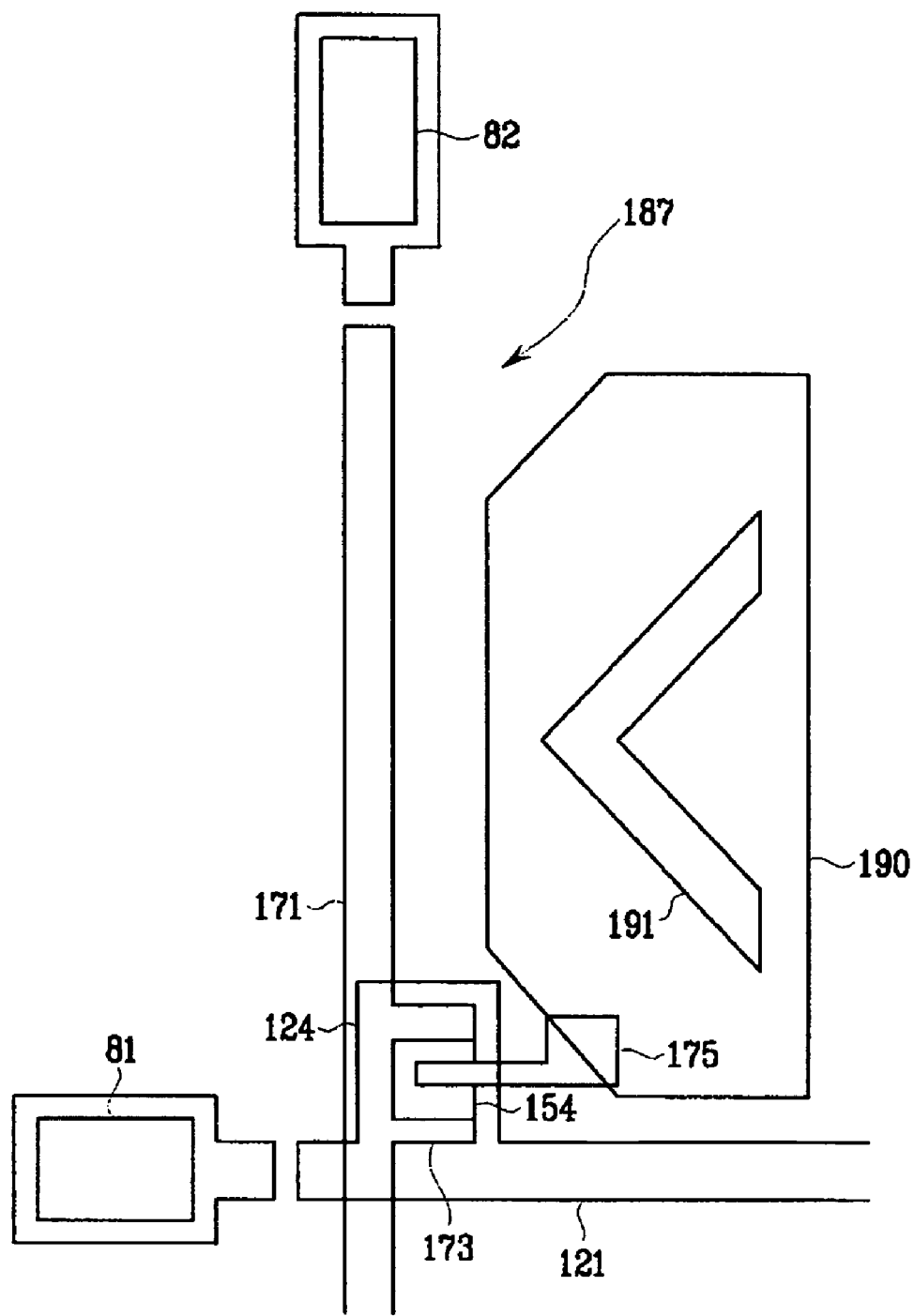
FIG. 12 is a layout view of a TFT array lower panel according to another embodiment of the present invention.

FIG. 12 is a layout view of a TFT array panel according to another embodiment of the present invention.

As shown in FIG. 12, the layered structures of the panels are substantially the same as those shown in FIGS. 1 to 2B.

The plurality of gate lines 121 including the plurality of a gate electrodes 124 and end portions are formed on the substrate 110, and the gate insulating layer 140, the plurality of semiconductor stripes 151 including the plurality of projections 154, and the plurality of ohmic contact stripes 161 including the plurality of projections 163 and the plurality of ohmic contact islands 165 are sequentially formed thereon. The plurality of data lines 171 including the plurality of source electrodes 173 and end portions, and the plurality of drain electrodes 175 are formed on the ohmic contacts 161 and 165, and the passivation layer 180 having the plurality of openings 187 and the plurality of contact holes is formed thereon the plurality of pixel electrodes 190 and the plurality of contact assistants 81 and 82 are formed in the openings 187 and the contact holes of the passivation member 180.

The pixel electrodes 190 have cutouts 191 and the passivation member 180 includes the portion formed in the cutouts 191.

The manufacturing method of the TFT array panels shown in FIG. 12 is substantially the same as that shown in FIGS. 1 to 11B.

When the pixel electrodes 190 are formed, the cutouts 191 are patterned, and the portion of the passivation layer 180 remains in the cutouts 191.

Figure 13:
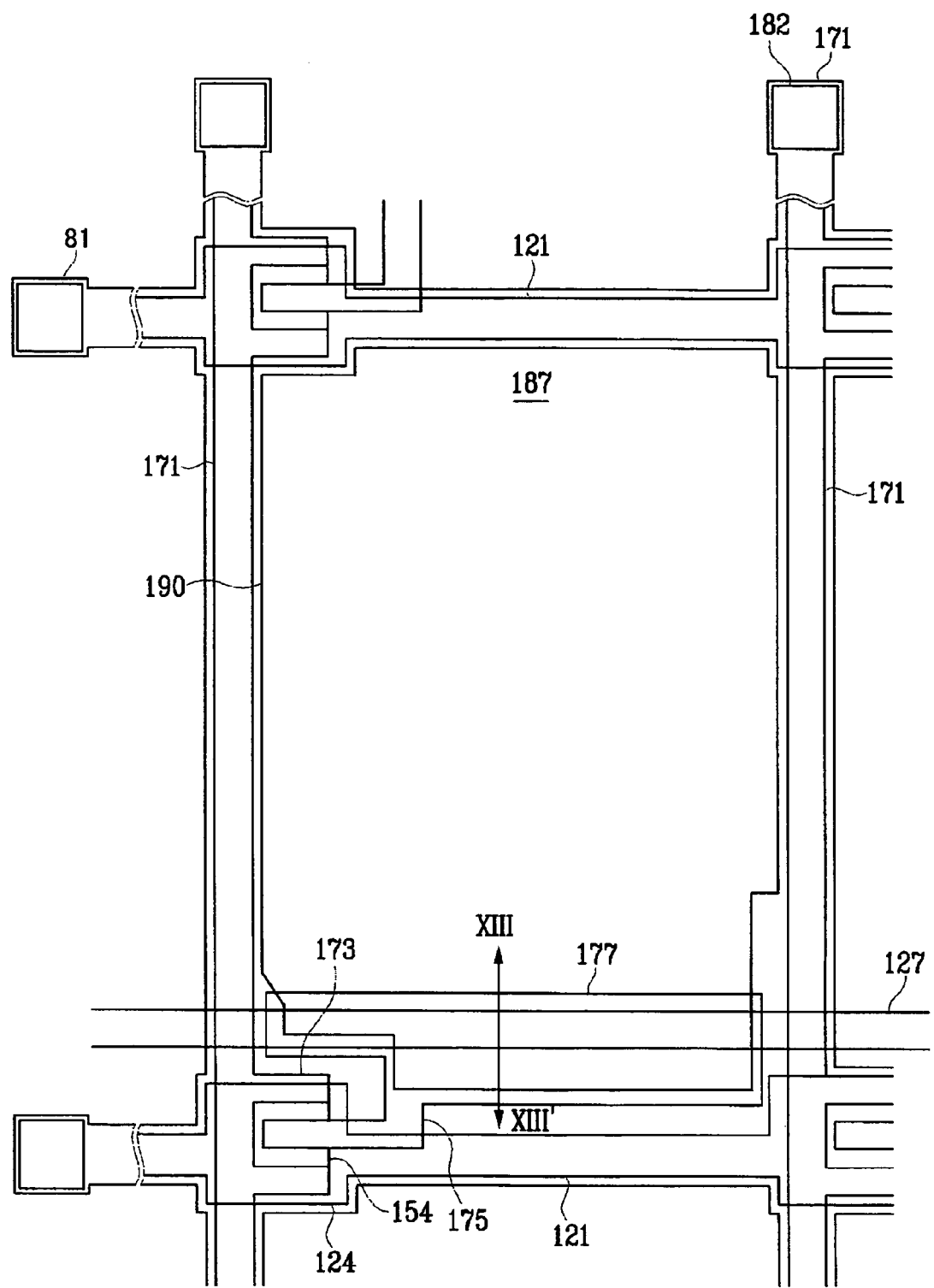
FIG. 13 is a layout view of a TFT array lower panel according to another embodiment of the present invention.
Figure 14:
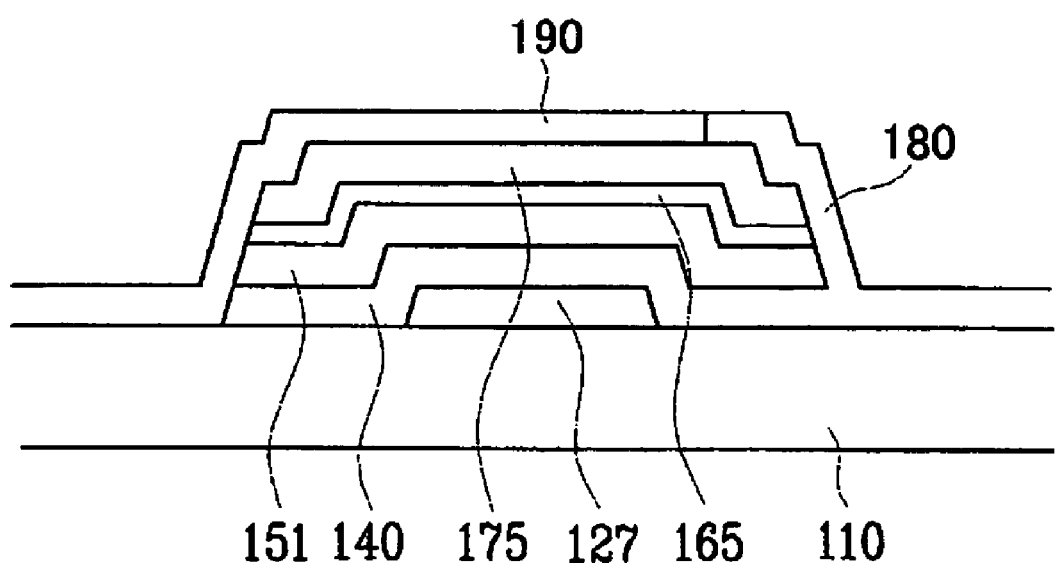
FIG. 14 is a sectional view of the TFT array panel shown in FIG. 13 taken along the line XIV-XIV.

FIG. 13 is a layout view of a TFT array lower panel according to another embodiment of the present invention, and FIG. 14 is a sectional view of the TFT array panel shown in FIG. 13 taken along the line XIII-XIII'.

As shown in FIGS. 13 and 14, the layered structures of the panels are substantially the same as those shown in FIGS. 1 to 2B.

The plurality of gate lines 121 including the plurality of a gate electrodes 124 and end portions are formed on the substrate 110, and the gate insulating layer 140, the plurality of semiconductor stripes 151 including the plurality of projections 154, and the plurality of ohmic contact stripes 161 including the plurality of projections 163 and the plurality of ohmic contact islands 165 are sequentially formed thereon. The plurality of data lines 171 including the plurality of source electrodes 173 and end portions, and the plurality of drain electrodes 175 including the widened end portion 177 are formed on the ohmic contacts 161 and 165, and the passivation layer 180 having the plurality of openings 187 and the plurality of contact holes is formed thereon. The plurality of pixel electrodes 190 and the plurality of contact assistants 81 and 82 are formed in the openings 187 and the contact holes of the passivation member 180.

As shown in FIGS. 13 and 14, the plurality of storage electrode lines 127 which are separated from the gate lines 121, are formed on the same layer as the gate lines 121. The storage electrode lines 127 are supplied with a predetermined voltage such as a common voltage, which is applied to a common electrode (not shown) on a common electrode panel (not shown). The widened end portion 177 of the drain electrode 175, and the semiconductor layer 151, the ohmic contact islands 165, and the gate insulating layer 140 thereunder between the pixel electrode 190 and the storage electrode lines 127 have a large enough area to completely cover the storage electrode line 127 overlapping the pixel electrode 190, and accordingly the storage electrode lines 127 are not directly contacted with the pixel electrodes 190.

Concerning an LCD, the pixel electrode 190 and a common electrode form a liquid crystal capacitor, which stores applied voltages after turn-off of the TFT. An additional capacitor called a storage capacitor, which is connected in parallel to the liquid crystal capacitor, is provided for enhancing the voltage storing capacity. The storage capacitors are implemented by overlapping the pixel electrodes 190 with the storage electrode lines 127 and the drain electrodes 175 connected to the pixel electrodes 190 with the storage electrode lines 127. Since the overlapping area of the storage electrode lines 127 overlapping the wide end portions 177 is large, the capacitance of the storage capacitors, i.e., the storage capacitance, is large.

Embodiments of present invention can be employed with any display device including LCDs and OLEDs. Each pixel of the OLED display includes at least two thin film transistors including a first thin film transistor connected to gate lines and data lines and a second thin film transistor connected to pixel electrodes. Each pixel also includes an organic light emitting member disposed between the pixel electrode and common electrode.

As described above, the pixel electrodes and the passivation member are formed using one photo-mask. Accordingly, a lithography step for forming the passivation layer is omitted to simplify the manufacturing method, thereby reducing the manufacturing time and the cost.

Although preferred embodiments of the present invention have been described in detail hereinabove, it should be clearly understood that many variations and/or modifications of inventive concepts herein taught which may appear to those skilled in the present art will still fall within the spirit and scope of the present invention.

What is claimed is:

1. A method of manufacturing a thin film transistor array panel, the method comprising:
   forming a gate line including a gate electrode on a substrate;
   forming a gate insulating layer on the gate line;
   forming a semiconductor layer on the gate insulating layer;
   forming an ohmic contact layer on the semiconductor layer;
   forming a data line including a source electrode and a drain electrode on the ohmic contact layer;
   depositing a conductive film on the data line and the drain electrode;
   forming a first photoresist on the conductive film;
   etching the conductive film using the first photoresist as a mask to form a pixel electrode at least connected to the drain electrode;
   depositing a passivation layer; and
   removing the first photoresist and a portion of the passivation layer thereon simultaneously to form a passivation member,
   wherein the gate insulating layer and the semiconductor layer are simultaneously etched, and wherein a boundary of a portion of the passivation layer disposed directly on a top surface of the drain electrode faces a boundary of the pixel electrode.

2. The method of claim 1, wherein a portion of the passivation layer deposited on the first photoresist removed with the first photoresist.

3. The method of claim 1, wherein a portion of the substrate and a portion of the drain electrode are exposed.

4. The method of claim 3, wherein the exposed portions of substrate and the drain electrode are enclosed by the gate line and the data line.

5. The method of claim 1, wherein a portion of the pixel electrode contacts an exposed portion of the substrate.

6. The method of claim 1, wherein the formation of the pixel electrode comprises forming contact assistants on the gate line and the data line.

7. The method of claim 1, wherein the formation of the semiconductor layer and the formation of the data line comprise:

depositing the gate insulating layer, the semiconductor layer an intrinsic a-Si layer, the ohmic contact layer an extrinsic a-Si layer, and a conductive layer in sequence, wherein the semiconductor layer is an intrinsic a-Si layer, and the ohmic contact layer is an extrinsic a-Si layer;

forming a second photoresist on the conductive layer, having different thicknesses on different portions of the conductive layer;

selectively etching the conductive layer, the semiconductor layer, and the ohmic contact layer using the second photoresist as a mask;

etching the second photoresist to form a third photoresist; and selectively etching the data line, the semiconductor layer, and the ohmic contact layer using the third photoresist as a mask to form the data line, the source electrode, the drain electrode, and the ohmic contact layer.

8. The method of claim 7, wherein the second photoresist is formed by using a photomask including a light blocking area, a translucent area, and a light transmitting area.

9. The method of claim 8, wherein an ashing process is executed to form the third photoresist.

10. The method of claim 9, wherein the ashing process is executed until a portion of the second photoresist facing the translucent area of the photomask is removed.

11. The method of claim 1, wherein the data line and the drain electrode include molybdenum or chromium.

12. The method of claim 1, wherein the pixel electrode includes indium tin oxide, amorphous indium tin oxide, or indium zinc oxide.

13. The method of claim 1, further comprising forming a storage electrode line with the same layer as the gate line.

14. The method of claim 13, wherein the pixel electrode and the storage electrode line are overlapped to each other via the drain electrode.

15. The method of claim 1, wherein the gate insulating layer has the substantially same planar shape as the semiconductor.

16. The method of claim 1, wherein there is a gap between the passivation layer and the pixel electrode, and the gap exposes a portion of a top surface of the drain electrode.

* * * * *